United States Patent
Natarajan et al.

(10) Patent No.: US 10,558,767 B1
(45) Date of Patent: Feb. 11, 2020

(54) ANALYTICAL DERIVATIVE-BASED ARMA MODEL ESTIMATION

(71) Applicant: Amazon Technologies, Inc., Seattle, WA (US)

(72) Inventors: Ramesh Natarajan, Pleasantville, NY (US); Jonathan Richard Morley Hosking, Skarsdale, NY (US)

(73) Assignee: Amazon Technologies, Inc., Seattle, WA (US)

(*) Notice: Subject to any disclaimer, the term of this patent is extended or adjusted under 35 U.S.C. 154(b) by 316 days.

(21) Appl. No.: 15/461,382

(22) Filed: Mar. 16, 2017

(51) Int. Cl.
| | | |
|---|---|---|
| *G06F 17/50* | (2006.01) | |
| *G06F 17/16* | (2006.01) | |
| *G06F 17/18* | (2006.01) | |
| *G06F 7/58* | (2006.01) | |
| *H03H 17/02* | (2006.01) | |

(52) U.S. Cl.
CPC .......... *G06F 17/5009* (2013.01); *G06F 7/582* (2013.01); *G06F 17/16* (2013.01); *G06F 17/18* (2013.01); *H03H 17/0257* (2013.01)

(58) Field of Classification Search
CPC ...... G06F 17/5009; G06F 7/582; G06F 17/18; H03H 17/0257
USPC .............................................................. 703/2
See application file for complete search history.

(56) References Cited

U.S. PATENT DOCUMENTS

| | | | | |
|---|---|---|---|---|
| 5,544,281 A | * | 8/1996 | Maruoka ................... | G06N 5/04 706/58 |
| 5,748,851 A | * | 5/1998 | Iokibe ..................... | G06F 17/18 706/58 |
| 6,091,361 A | * | 7/2000 | Davis ........................ | G01S 7/36 342/195 |
| 6,125,105 A | * | 9/2000 | Edwards ................ | G06Q 10/06 370/230 |
| 6,574,587 B2 | * | 6/2003 | Waclawski .......... | G06F 11/3409 702/179 |
| 6,577,962 B1 | * | 6/2003 | Afshari .................. | G06Q 10/06 702/61 |
| 6,928,398 B1 | * | 8/2005 | Fang ...................... | G06Q 10/06 703/2 |
| 7,827,128 B1 | * | 11/2010 | Karlsson ................ | G06Q 30/02 706/21 |

(Continued)

OTHER PUBLICATIONS

Brockwell et al. ("Introduction to Time Series and Forecasting", 2002, Springer-Verlag, pp. 1-434) (Year: 2002).*

(Continued)

*Primary Examiner* — Brian S Cook
*Assistant Examiner* — Iftekhar A Khan
(74) *Attorney, Agent, or Firm* — Knobbe, Martens, Olson & Bear, LLP

(57) ABSTRACT

Systems are provided to estimate autoregressive moving average (ARMA) models using maximum likelihood estimation and analytical derivatives, and to use such models for forecasting. The evaluation of the analytical derivatives during estimation of the model parameters may be performed using a state space representation with certain characteristics. An ARMA model estimated using maximum likelihood estimation, analytical derivatives, and the state space representation with certain characteristics can be used to forecast/predict values that are likely to occur in the future, given some set of previously-occurring values.

20 Claims, 4 Drawing Sheets

(56) References Cited

U.S. PATENT DOCUMENTS

| | | | | |
|---|---|---|---|---|
| 8,498,954 | B2* | 7/2013 | Malov | G06Q 30/0201 |
| | | | | 706/45 |
| 8,499,066 | B1* | 7/2013 | Zhang | H04L 47/823 |
| | | | | 709/223 |
| 9,152,918 | B1* | 10/2015 | McNair | G06N 7/005 |
| 9,703,664 | B1* | 7/2017 | Alshawabkeh | G06F 11/3414 |
| 10,078,569 | B1* | 9/2018 | Alshawabkeh | G06F 11/3414 |
| 10,088,814 | B2* | 10/2018 | Wenzel | G06F 17/50 |
| 2001/0036228 | A1* | 11/2001 | Skafidas | H04L 25/03038 |
| | | | | 375/232 |
| 2003/0061015 | A1* | 3/2003 | Ben-Gal | G06K 9/6282 |
| | | | | 703/2 |
| 2003/0193509 | A1* | 10/2003 | Brand | G06T 11/001 |
| | | | | 345/582 |
| 2003/0197965 | A1* | 10/2003 | Sternad | H04R 3/04 |
| | | | | 360/65 |
| 2003/0227887 | A1* | 12/2003 | Abrishamkar | H04B 1/7101 |
| | | | | 370/335 |
| 2004/0102937 | A1* | 5/2004 | Ibrahim | G05B 13/048 |
| | | | | 703/2 |
| 2004/0260664 | A1* | 12/2004 | Thiesson | G06F 17/18 |
| | | | | 706/21 |
| 2005/0209959 | A1* | 9/2005 | Tenney | G06Q 20/10 |
| | | | | 705/39 |
| 2006/0129395 | A1* | 6/2006 | Thiesson | G06K 9/00523 |
| | | | | 704/240 |
| 2006/0200034 | A1* | 9/2006 | Ricci | G06K 9/00523 |
| | | | | 600/513 |
| 2006/0247900 | A1* | 11/2006 | Brocklebank | G06F 17/5009 |
| | | | | 702/189 |
| 2008/0010043 | A1* | 1/2008 | Thiesson | G06K 9/6296 |
| | | | | 703/2 |
| 2009/0126023 | A1* | 5/2009 | Yun | G06F 21/577 |
| | | | | 726/25 |
| 2012/0310939 | A1* | 12/2012 | Lee | G06Q 10/04 |
| | | | | 707/739 |
| 2014/0325072 | A1* | 10/2014 | Zhang | H04L 47/823 |
| | | | | 709/226 |
| 2015/0088783 | A1* | 3/2015 | Mun | G06Q 10/04 |
| | | | | 705/36 R |
| 2016/0260052 | A1* | 9/2016 | Ray | G06Q 10/087 |
| 2016/0379676 | A1* | 12/2016 | Chatradhi | G11B 5/455 |
| | | | | 369/53.38 |
| 2016/0381596 | A1* | 12/2016 | Hu | H04B 7/18504 |
| | | | | 370/236 |
| 2017/0060810 | A1* | 3/2017 | Preston | G06F 17/5095 |
| 2017/0220926 | A1* | 8/2017 | Chhabra | G06Q 50/01 |
| 2018/0066943 | A1* | 3/2018 | Bortolami | G01C 25/005 |

OTHER PUBLICATIONS

Shumway et al. (An approach to time series smoothing and forecasting using the EM algorithm, Journal of Time Series Analysis vol. 3, No. 4, 1982, pp. 253-264) (Year: 1982).*

G. Peter Zhang ("Time series forecasting using a hybrid ARIMA and neural network model", Neurocomputing 50 (2003) 159-175) (Year: 2003).*

Eric Zivot ("Estimation of ARMA Models", 2005, pp. 1-5) (Year: 2005).*

Paul D. Gilbert ("State Space and ARMA Models: An Overview of the Equivalence", ISBN 0-662-20494-8, 1993, pp. 1-38) (Year: 1993).*

Singh et al. ("A Note on the Modelling and Analysis of Vector Arrma Processes with Nonstationary Innovations", Mathematical and Computer Modelling 36 (2002) 1409-1424) (Year: 2002).*

Brockwell, P. J., and Davis, R. A. (1987). Time Series: Theory andMethods. Springer.

De Jong, P., andMcKinnon, E. (1988). Covariances for smoothed estimates in state spacemodels. Biometrika, 75, 601-602.

Durbin, J., and Koopman, S. J. (2012). Time Series Analysis by State Space Methods. Oxford University Press.

Engle, R. F., and Watson, M. W. (1981). A one-factor multivariate time series model of metropolitan wage rates. Journal of the American Statistical Association, 76, 774-781.

Hamilton, J. D. (1995). Time series analysis. Economic Theory. II.. Princeton University Press, USA.

Hannan, E. J., and Rissanen, J. (1982). Recursive estimation of mixed autoregressive movingaverage order. Biometrika, 69, 81-94.

Koopman, S. J., and Shephard, N. (1992). Exact score for time series models in state space form. Biometrika, 79, 823-826.

Nagakura, D. (2013). Exact gradient vector of loglikelihood for linear Gcaussian state space models. StatisticalMethodology, 13, 69-94.

Segal, M., and Weinstein, E. (1988). A new method for evaluating the log-likelihood gradient (score) of linear dynamic systems. IEEE Transactions on Automatic Control 33, 763-766.

Segal,M., andWeinstein, E. (1989). A new method for evaluating the log-likelihood gradient, the Hessian, and the Fisher information matrix for linear dynamic systems. IEEE Transactions on Information Theory 35, 682-687.

Shumway, R. H., and Stoffer, D. S. (1982). An approach to time series smoothing and forecasting using the EM algorithm. Journal of Time Series Analysis, 3, 253-264.

Zadrozny, P. A. (1989). Analytic derivatives for estimation of linear dynamic models. Computers andMathematics with Applications, 18, 539-553.

* cited by examiner $$H = [0], \quad Z = [1 \quad 0 \quad \cdots \quad 0],$$

$$T = \begin{bmatrix} \phi_1 & 1 & 0 & \cdots & 0 \\ \phi_2 & 0 & 1 & \cdots & 0 \\ \vdots & \vdots & & \ddots & \\ \phi_{d-1} & 0 & 0 & \cdots & 1 \\ \phi_d & 0 & 0 & \cdots & 0 \end{bmatrix}, \quad R = \begin{bmatrix} 1 \\ -\theta_1 \\ -\theta_2 \\ \vdots \\ -\theta_{d-1} \end{bmatrix}, \quad Q = [\sigma^2]$$

*Fig. 3*

$$H = [0], \quad Z = [1 \quad -\theta_1 \quad -\theta_2 \quad \cdots \quad -\theta_{d-1}],$$

$$T = \begin{bmatrix} \phi_1 & \phi_2 & \cdots & \phi_{d-1} & \phi_d \\ 1 & 0 & \cdots & 0 & 0 \\ 0 & 1 & \cdots & 0 & 0 \\ \vdots & & \ddots & \vdots & \vdots \\ 0 & 0 & \cdots & 1 & 0 \end{bmatrix}, \quad R = \begin{bmatrix} 1 \\ 0 \\ 0 \\ \vdots \\ 0 \end{bmatrix}, \quad Q = [\sigma^2]$$

*Fig. 4*

ANALYTICAL DERIVATIVE-BASED ARMA MODEL ESTIMATION

BACKGROUND

Models representing data relationships and patterns, such as functions, algorithms, systems, and the like, may be used to generate output that corresponds to input in some way. In a common scenario, a set of data may be obtained, and a model of a theoretical function that generated the set of data may be sought. The function may be considered theoretical because the set of data may be obtained from a complex real world system, rather than from a well-defined function. For example, the data may include measurements related to the operation of a particular system, and it may be desirable to predict values for the measurements most likely to occur given certain input criteria. Various techniques may be used to model the theoretical function that best fits the set of data.

One technique for modeling sets of data is referred to as maximum likelihood estimation. Maximum likelihood estimation (MLE) is a statistical technique to determine, for a particular model, which parameters of the model are most likely to characterize a given set of data. For example, a set of data may appear to have a normal distribution. MLE can be used to determine the parameters (e.g., the mean and standard deviation) of the normal distribution that best characterizes the set of data. The determined parameters can then be used to predict which values are likely to occur given certain input.

BRIEF DESCRIPTION OF DRAWINGS

Throughout the drawings, reference numbers may be re-used to indicate correspondence between referenced elements. The drawings are provided to illustrate example embodiments described herein and are not intended to limit the scope of the disclosure.

FIG. 3 is a diagram of a state space representation for use in estimating models using maximum likelihood estimation according to some embodiments.

FIG. 4 is a diagram of another state space representation for use in estimating models using maximum likelihood estimation according to some embodiments.

DETAILED DESCRIPTION

Introduction

Figure 1:
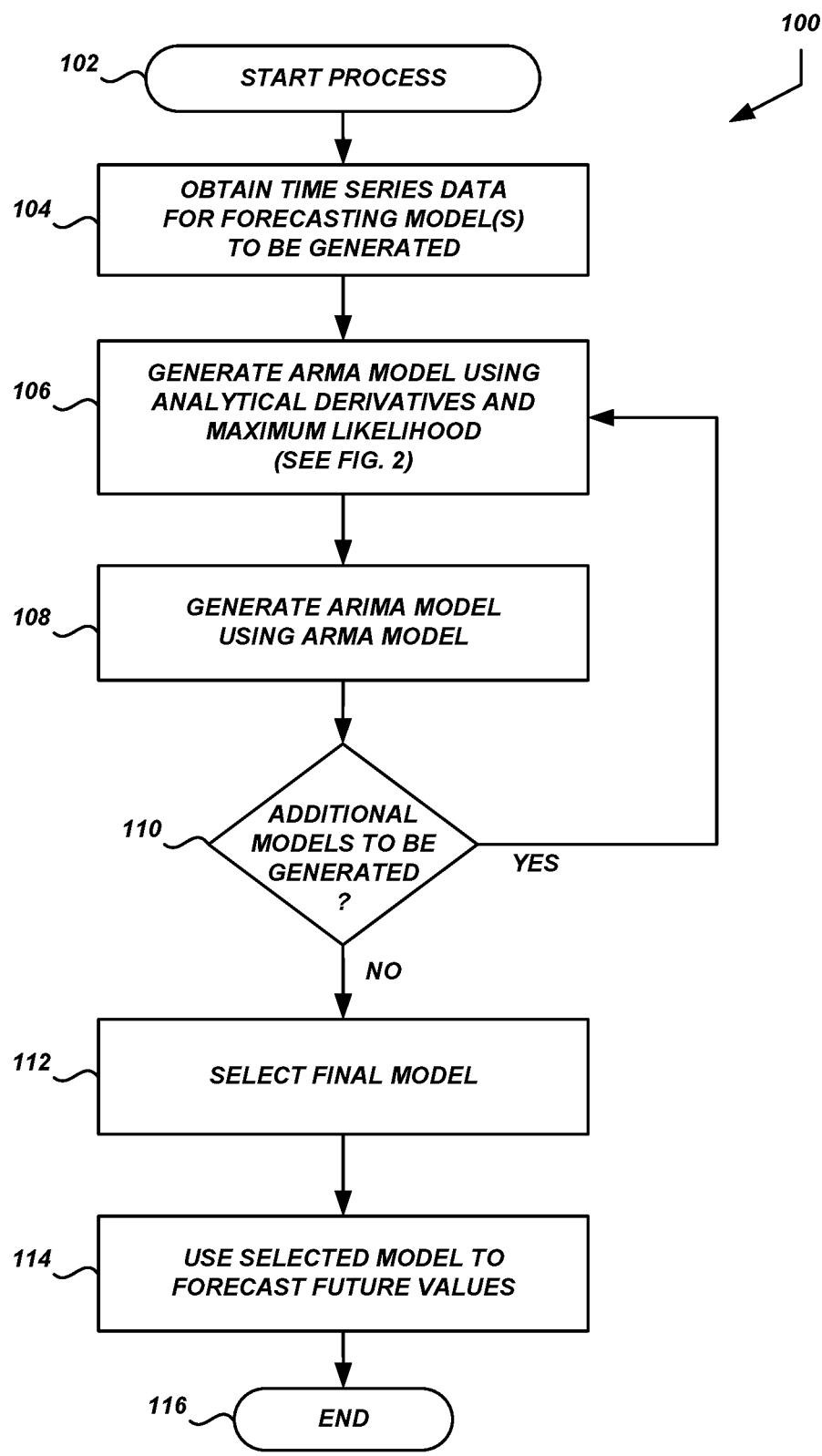
FIG. 1 is a flow diagram of an illustrative process for estimating and using models according to some embodiments.

The present disclosure is directed to estimating autoregressive moving average (ARMA) models using maximum likelihood estimation and analytical derivatives. Generally described, ARMA models are tools for understanding time series data and predicting future values of the time series. An ARMA model consists of an autoregressive (AR) component and a moving average (MA) component. The AR component describes how values in the time series depend on previously-occurring values in the time series, while the MA component describes how values of the time series depend on random error terms associated with values in the time series. In some embodiments, an ARMA model estimated using maximum likelihood estimation and analytical derivatives can be used to forecast/predict values that are likely to occur in the future, given some set of previously-occurring values. For example, such ARMA models may be estimated and used for a variety of forecasting and prediction applications and systems, including but not limited to financial forecasting, inventory planning, capacity planning, medical devices, sensor-device-based "internet of things" (IOT) technologies, and the like.

Some ARMA model estimation systems use maximum likelihood estimation (MLE) to determine the parameters of the ARMA model that are most likely to produce a given set of time series data. For example, the parameters of the ARMA model may be initialized and then repeatedly adjusted until the parameters that best fit the given time series data are found to an acceptable degree of certainty. A likelihood function is used to evaluate how likely a current set of model parameter values are to produce the given time series of values. In such systems, the maximization of this likelihood function—finding the model parameters that produce the greatest likelihood value—may be used to provide the desired model parameters. For example, adjustments to the model parameters are determined using the derivative of the likelihood function (also referred to as the gradient) with respect to the individual parameters. The derivative is used to determine the direction and degree to which individual parameters are to be adjusted in order to produce model output that is expected to be more accurate. Some conventional methods of determining the derivative are "numerical" methods in which derivatives of the likelihood function with respect to each model parameter are repeatedly approximated until a result is found to an acceptable degree of confidence. However, these numerical methods may be inefficient when a model has multiple parameters, because the derivative of the likelihood function with respect to each individual parameter is numerically estimated separately from the derivatives with respect to each other parameter. Because the process of model estimation involves repeatedly determining the derivatives and adjusting the model parameters, using numerical estimation of derivatives for a model with many parameters can be inefficient.

An analytical derivative of the likelihood function, such as one determined by applying the chain rule to defined derivative functions for various parameters and matrices in a state space representation of the model, can provide improved performance in comparison with numerical derivatives. For example, determination of the derivative of the likelihood function for any current set of model parameters can be performed in a single process, rather than performing a numerical approximation of the derivative of the likelihood function with respect to each parameter separately. Thus, determining the derivative of the likelihood function for a model with x parameters (where x is a positive integer) and determining the derivative of the likelihood function for a model with y parameters (where y is a positive integer greater than x) can take the same or about the same amount of time and computing resources. In contrast, numerical approximation of the derivatives for these models will be slower for the model with y parameters than the model with x parameters, and the total time and computing resources required to determine the derivative will increase as the number of model parameters increases.

One algorithm for estimating a model is described in Shumway, R. H., and Stoffer, D. S., "An approach to time series smoothing and forecasting using the EM algorithm,"

Journal of Time Series Analysis, Vol 3, No. 4, pp. 253-264. 1982, which is hereby incorporated by reference in its entirety. This algorithm may be referred to as the Shumway-Stoffer algorithm. Some conventional model estimation systems use the Shumway-Stoffer algorithm and state space representations of models. However, if used with analytical derivatives to estimate ARMA models, the Shumway-Stoffer algorithm produces incorrect results when performed using the standard, canonical state space representation of ARMA models. This may be because the standard state space representation used in estimation of ARMA models (e.g., the state space representation used in numerical-derivative-based estimation of ARMA models) violates certain assumptions of the Shumway-Stoffer algorithm. For example, the Shumway-Stoffer algorithm assumes that a particular matrix, known as the state transition covariance matrix, is invertible or that its null space is not associated with any of the components of a corresponding state space matrix, known as the state transition matrix, that contain unknown parameters to be estimated. However, the standard state space representation of ARMA models does not conform to these assumptions, and therefore the desired analytical derivatives cannot be obtained using the Shumway-Stoffer algorithm and this standard, canonical state space representation.

Some aspects of the present disclosure relate to generating an alternative state space representation of an ARMA model that may be used (e.g., with the Shumway-Stoffer algorithm) to estimate an ARMA model using MLE and analytical derivatives. State space representations include a number of different matrices and vectors, including an observation noise variance matrix, an innovation variance matrix, a state transition matrix, and an observation matrix. In some embodiments, the parameters of the AR component of the ARMA model to be estimated may be placed in the first row of the state transition matrix. This differs from the standard, canonical state space representation in which the parameters of the AR component are arranged down the first column of the state transition matrix. In some embodiments, the parameters of the MA component of the ARMA model may be placed in the observation matrix. This differs from the standard, canonical state space representation in which the parameters of the MA component are placed in a column vector separate from the above-referenced matrices. By placing the AR parameters in the first row of the state transition matrix and the MA parameters in the observation matrix, the state space representation may be used (e.g., with the Shumway-Stoffer algorithm) to accurately generate the parameters of the ARMA model using analytical derivatives and maximum likelihood estimation. Moreover, MLE performed using a state space model in this manner is more efficient than the using numerical derivatives in estimating an ARMA model.

Additional aspects of the disclosure relate to using ARMA models, generated using analytical derivatives and maximum likelihood estimation, to forecast future values of time series data from which the ARMA models were generated. In some embodiments, the forecasting may be done on a number of different sets of time series data, serially, asynchronously, or in parallel. For example, a set of ARMA models may be estimated, with a separate ARMA model being generated for each different set of time series data. The ARMA models may be estimated on-demand or periodically, such as every day, every week, every month, every quarter-year, etc. Once the ARMA models are estimated, they may be used to forecast future values of their respective sets of time series data, and automatic or manual processes may be initiated based on the forecasted values. Then, when actual values for the future periods of time are obtained, the ARMA models may be updated or re-estimated.

Although aspects of some embodiments will be described, for the purpose of illustration, using a particular notation, the examples are illustrative only and are not intended to be limiting. For example, embodiments will be described using the notation published in Durbin, J., and Koopman, S. J., "Time Series Analysis by State Space Methods," Oxford University Press, 2012, which is hereby incorporated by reference in its entirety. However, the same embodiments may also be understood using any of a number of equivalent but different notations without departing from the specific technical details of the disclosure. Using the notation of Durbin and Koopman, a state space model may be set forth using equation [1] (the observation equation) and equation [2] (the state transition equation) below:

$$y_t = Z\alpha_t + \varepsilon_t \quad [1]$$

$$\alpha_{t+1} = T\alpha_t + R\eta_t \quad [2]$$

where Z is the observation matrix, T is the state transition matrix, R is a column vector, $\varepsilon_t$ is the observation noise, $\eta_t$ is the state disturbance, and $\alpha_t$ is the initial state. The vectors $y_t$, $\alpha_t$, and $\eta_t$ have respective dimensions p, m, and r, with r<=m. In addition, the vectors $\varepsilon_t$, $\eta_t$, and $\alpha_t$ have normal distributions as set forth in [3] below:

$$\varepsilon_t \sim N(0,H), \eta_t \sim N(0,Q), \alpha_t \sim N(a_1, P_1) \quad [3]$$

where H is the observation noise variance matrix and Q is the innovation variance matrix. Various aspects of the disclosure will now be described with regard to certain examples and embodiments, which are intended to illustrate but not limit the disclosure.

Example Process for Estimating and Using Models

With reference to an illustrative embodiment, FIG. 1 shows an example process 100 for generating and using models of time series data. Advantageously, the process 100 includes generating ARMA models using maximum likelihood estimation with analytical derivatives, thereby producing models that are more accurate than models estimated using numerical derivatives, and producing models more efficiently than using numerical derivatives. Accordingly, the operation of the computing system executing the process 100, such as the modeling system 500 shown in FIG. 5, can be improved. In addition, models may be generated using data that is more fine-grained than would currently be feasible given the comparatively inefficient numerical-derivative-based methods.

The process 100 shown in FIG. 1 begins at block 102. The process 100 may begin in response to an event, such as when execution of the modeling system 500 begins, when initiated by a system administrator, etc. When the process 100 is initiated or at some time prior thereto, a set of executable program instructions stored on one or more non-transitory computer-readable media (e.g., hard drive, flash memory, removable media, etc.) may be loaded into memory (e.g., random access memory or "RAM") of a computing device or system, such as the modeling system 500. The executable instructions may then be executed by a hardware-based computer processor (e.g., a central processing unit or "CPU," a graphics processing unit or "GPU," etc.) of the computing device or system. In some embodiments, the process 100 or portions thereof may be implemented on multiple processors, devices, or systems, either serially or in parallel.

At block 104, the modeling system 500 or some other computing system can obtain time series data for the forecasting models to be generated. For example, the time series data may be information representing the state or output of a particular process over the course of time (e.g., medical monitoring information, profit and loss information, etc.). It may be desired to estimate a model that describes the time series data. The model may be an ARMA model, or another model of which an ARMA model is a component. On example of a time series model that includes an ARMA model component is an autoregressive integrated moving average (ARIMA) model.

Figure 2:
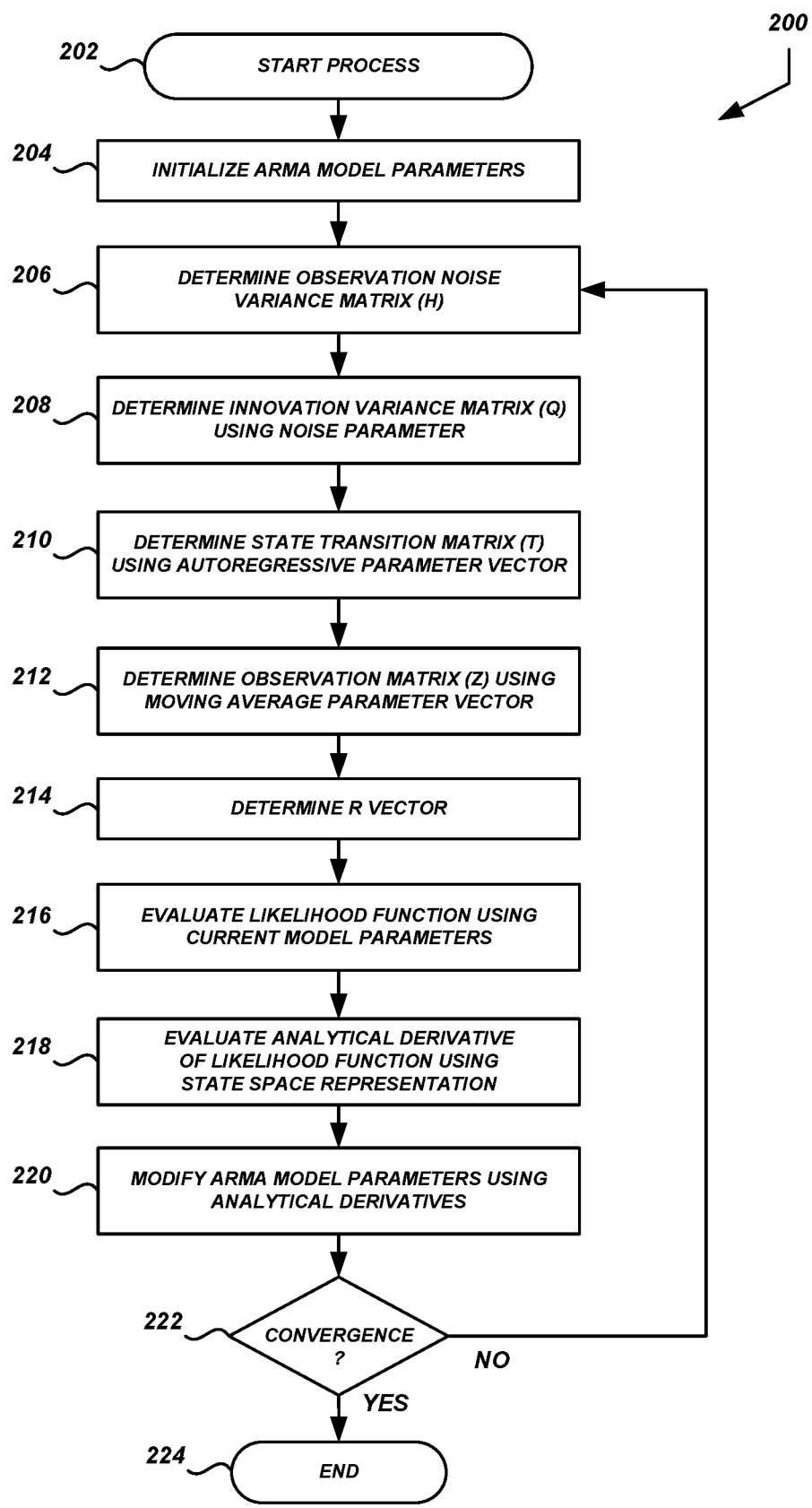
FIG. 2 is a flow diagram of an illustrative process for estimating models using analytical derivatives and maximum likelihood estimation according to some embodiments.

At block 106, the modeling system 500 or some other computing system can generate an ARMA model for a set of time series data using maximum likelihood estimation with analytical derivatives. An example process for generating an ARMA model in this manner is shown in FIG. 2 and described in greater detail below.

At block 108, the modeling system 500 or some other computing system can generate an ARIMA model using the ARMA model generated at block 106. In some embodiments, no ARIMA model may be generated; rather, the ARMA model may be used independently, or a different type of model may be generated of which the ARMA model is a component.

At decision block 110, the modeling system 500 or some other computing system can determine whether additional models are to be generated. For example, the process 100 may be used to generate a number of different models for a given set of time series data, and then the best or most accurate model may be selected as described below. The different models may be generated by, e.g., using different initial parameter values, applying different transformations to the time series data values, or altering some other portion of the process. Advantageously, by using processes described herein to estimate models using MLE and analytical derivatives, the generation of multiple models (e.g., dozens, hundreds, or more) for a particular set of time series data becomes feasible, whereas existing techniques may not be fast enough to reasonable do so. If additional models are to be generated, the process 100 can return to block 106; otherwise, the process 100 can proceed to block 112. In some embodiments, only a single model may be generated.

At block 112, the modeling system 500 or some other computing system can select a final model for a particular set of time series data when multiple models for the time series data have been generated above. The selection may be based on one or more selection criteria, such as which model has the highest likelihood score.

At block 114, the modeling system 500 or some other computing system can use the selected model to forecast future values for the time series modeled by the selected model. For example, if the time series relates to medical monitoring, future values for the particular measurement being monitored can be forecasted. In some embodiments, the forecasted values can trigger additional processes, such as administration of medication or notification of medical personnel. As another example, if the time series relates to a particular financial or business characteristic such as profits or inventory levels, then future values for the characteristic can be forecasted. In some embodiments, the forecasted values can trigger additional processes such as setting of prices, acquisition or transfer of inventory, etc. In some embodiments, the process 100 or portions thereof may be performed to generate models for applications other than forecasting and prediction. For example, ARIMA models may be generated for input-output analysis, transfer function modeling, etc. In other embodiments, the process 100 or portions thereof may be performed to generate models for other applications altogether.

FIG. 2 shows an example process 200 for estimating an ARMA model using MLE and analytical derivatives. Advantageously, the process 200 includes using a particular state space representation of the ARMA model that works with analytical derivatives and produces an accurate model in less time than using MLE and numerical derivatives to estimate the model. Accordingly, the operation of the computing system executing the process 200, such as the modeling system 500 shown in FIG. 5, can be improved. For example, in experimental implementations of the process 200 and portions thereof, the speed at which ARMA models are estimated has been improved on the order of five to eight times in comparison with use of numerical derivatives, while also producing ARMA models that are at least as accurate, if not more accurate, than those produced using numerical derivatives.

The process 200 shown in FIG. 2 begins at block 202. The process 200 may begin in response to an event, such as when block 106 of process 100 is reached. In some embodiments, the process 200 may be performed independently of the process 100. When the process 200 is initiated or at some time prior thereto, a set of executable program instructions stored on one or more non-transitory computer-readable media (e.g., hard drive, flash memory, removable media, etc.) may be loaded into memory (e.g., random access memory or "RAM") of a computing device or system, such as the modeling system 500. The executable instructions may then be executed by a hardware-based computer processor (e.g., a central processing unit or "CPU," a graphics processing unit or "GPU," etc.) of the computing device or system. In some embodiments, the process 200 or portions thereof may be implemented on multiple processors, devices, or systems, either serially or in parallel.

At block 204, the modeling system 500 or some other computing system can initialize the ARMA model parameters. Illustratively, ARMA model parameters may include a set of AR parameters, a set of MA parameters, and a noise parameter. In some embodiments, the AR parameters may each be labeled $\varphi$ with a subscript, where $\varphi_i$ is the ith AR parameter. In some embodiments, the MA parameters may each be labeled $\theta$ with a subscript, where $\theta_i$ is the ith MA parameter. In some embodiments, the noise parameter may be labeled $\sigma$. By way of example, an ARMA model may be notated ARMA(p, q), where p is the number of AR parameters and q is the number of MA parameters. In this example, d=max(p, q+1), the AR parameters may be labeled $\varphi_1$ to $\varphi_d$, and the MA parameters may be labeled $\theta_1$ to $\theta_{d-1}$. Initialization of the ARMA parameters may be performed using a pseudo-random process in which a random number generation algorithm is seeded and used to generate pseudo random values for each parameter (or some subset thereof). In some embodiments, the ARMA model parameters may not be initialized using a pseudo-random process. Instead, the parameters may be selectively initialized or computed. For example, the model parameters may be initially set to—or derived from—the parameter values determined the last time an ARMA model was estimated for the same time series.

Once the parameters of the ARMA model have been initialized, a state space representation of the ARMA model may be generated. State space representations of ARMA models may include a number of different matrices and vectors, including an observation noise variance matrix, an innovation variance matrix, a state transition matrix, and an observation matrix. FIGS. 3 and 4 show illustrative state space representations of ARMA models. The standard, canonical state space representation 300 is shown in FIG. 3, and is generally used with numerical derivative approximation methods. This standard state space representation 300 cannot be used to determine analytical derivatives of likelihood functions because it will not produce accurate results. An alternative state space representation 400 is shown in FIG. 4. This alternative state space representation 400 may be used (e.g., with the Shumway-Stoffer algorithm) to accurately determine analytical derivatives of likelihood functions. In the illustrated state space representations 300 and 400, the observation noise variance matrix 302, 402 is labeled H, the observation matrix 304, 404 is labeled Z, the state transition matrix 306, 406 is labeled T, a column vector 308, 408 is labeled R, and the innovation variance matrix 310, 410 is labeled Q. In general, the different matrices and vectors may be determined in any order, serially, asynchronously, or in parallel. Therefore, in some embodiments, the order of operations to generate the state space representation may not necessarily be performed in the same order as shown in FIG. 2 and described below.

At block 206, the modeling system 500 or some other computing system can determine the observation noise variance matrix, also referred to as the H matrix. As shown in FIG. 4, the H matrix 402 may be a single element matrix. In some embodiments, the single element of the H matrix 402 may always be set to 0, and therefore a step of determining the H matrix may not necessarily be expressly performed. Rather, a static H matrix with a single 0-value element may be automatically used in the subsequent derivation operations. In some embodiments, H may have a non-zero value that is static or dynamically determined. As shown in FIGS. 3 and 4, the H matrix may take the same form and value in both the standard state space representation 300 and the alternative state space representation 400.

At block 208, the modeling system 500 or some other computing system can determine the innovation variance matrix, also referred to as the Q matrix, using the noise parameter σ. As shown in FIG. 4, the Q matrix 410 may be a single element matrix. In some embodiments, the single element of the Q matrix 410 may be set to $\sigma^2$. As shown in FIGS. 3 and 4, the Q matrix may take the same form and value in both the standard state space representation 300 and the alternative state space representation 400.

At block 210, the modeling system 500 or some other computing system can determine the state transition matrix, also referred to as the T matrix, using a vector of AR parameters. As shown in FIG. 4, the T matrix 406 may be a square d×d matrix, where p is the number of AR parameters, q is the number of MA parameters, and d=max(p, q+1). The AR parameters $\varphi_1$ to $\varphi_d$ may be arranged in the top row of the T matrix. In some embodiments, elements of a diagonal running from the first element of the second row to the second to last element of the last row may all be set to 1. In some embodiments, the remainder of the elements (e.g., other than the first row and the diagonal described above) may all be set to zero. As shown in FIGS. 3 and 4, the T matrix in the alternative state space representation 400 is different from the T matrix in the standard state space representation 300. For example, the standard state space representation 300 includes the AR parameters $\varphi_1$ to $\varphi_d$ down the first column of the T matrix 306, rather than in the first row.

At block 212, the modeling system 500 or some other computing system can determine the observation matrix, also referred to as the Z matrix, using a vector of MA parameters. As shown in FIG. 4, the Z matrix 404 may be a 1×(d−1) matrix, where d=max(p, q+1) as described above. The MA parameters $\theta_1$ to $\theta_{d-1}$ may therefore be arranged in the single row of the Z matrix. As shown in FIGS. 3 and 4, the Z matrix in the alternative state space representation 400 is different from the Z matrix in the standard state space representation 300. For example, the standard state space representation 300 includes the MA parameters $\theta_1$ to $\theta_{d-1}$ in the R vector 308 rather than in the Z matrix 306. In the standard state space representation 300, the Z matrix is a single-row matrix with the first element having a value of 1 and the remaining elements having values of 0.

At block 214, the modeling system 500 or some other computing system can determine the remaining component of the state space representation, also referred to as the R vector. As shown in FIG. 4, the R vector 408 may be column vector with d elements, where d=max(p, q+1) as described above. In some embodiments, the first element of the R vector may be set to 1, and the remaining elements may be set to 0. Therefore, a step of determining the R vector may not necessarily be expressly performed. Rather, a static R vector with values as shown in FIG. 4 may be automatically used in the subsequent derivation operations. As shown in FIGS. 3 and 4, the R vector in the alternative state space representation 400 is different from the R vector in the standard state space representation 300. For example, the standard state space representation 300 includes the MA parameters $\theta_1$ to $\theta_{d-1}$ in the R vector 308 rather than in the Z matrix 306.

At block 216, the modeling system 500 or some other computing system can evaluate the likelihood function using the current model parameters. The likelihood function is used to determine how likely it is that the current parameters are the best set of parameters for the time series data being modeled. In some embodiments, the likelihood function is obtained using a Kalman filter. If $Y_t$ denotes information available at time t (e.g., $Y_t = \{y_1, \ldots, y_t\}$), then the Kalman filter can compute the quantities $a_t \equiv E(\alpha_t|Y_{t-1})$ and $P_t \equiv \text{var}(\alpha_t|Y_{t-1})$. The filtering equations are set forth in equations [4] through [7]:

$$v_t = y_t - Za_t \quad [4]$$

$$F_t = ZP_tZ^T + H \quad [5]$$

$$a_{t+1} = Ta_t + K_tv_t \quad [6]$$

$$P_{t+1} = TP_tL_t^T + RQR^T \quad [7]$$

where $K_t$ and $L_t$ are defined according to equations [8] and [9], respectively:

$$K_t = TP_tZ^TF_t^{-1} \quad [8]$$

$$L_t = T - KP_tZ = T - TP_tZ^TF_t^{-1}Z \quad [9]$$

Various smoothing operations may also be performed. State smoothing gives estimates of the mean and variance of a state at each time point, given the entire data. State smoothing iterations start with $r_n = 0$ and $N_n = 0$, and proceed with equations [10] through [13] below:

$$r_{t-1} = Z^TF_t^{-1}v_t + L_t^Tr_t \quad [10]$$

$$N_{t-1} = Z^TF_t^{-1}Z + L_t^TN_tL_t \quad [11]$$

$$\hat{\alpha}_t = a_t + P_tr_{t-1} \quad [12]$$

$$V_t = P_t - P_tN_{t-1}P_T \quad [13]$$

Disturbance smoothing gives estimates of the observation noise (disturbance in the observation equation) and state disturbance (disturbance in the state transition equation), along with related variances. For example, the observation noise can be estimated, and a related variance and covariance can be found, using equations [14]-[16] below:

$$\hat{\varepsilon}_t = y_t - Z\hat{\alpha}_t \quad [14]$$

$$\text{var}(\varepsilon_t | Y_n) = ZV_t Z^T \quad [15]$$

$$\text{cov}(\varepsilon_t, \alpha_t | Y_n) = -ZV_t \quad [16]$$

The state disturbance can be estimated, and a related variance and covariance can be found, using equations [17]-[19] below:

$$\eta_t = QR^T r_t \quad [17]$$

$$\text{var}(\eta_t | Y_n) = Q - QR^T N_t RQ \quad [18]$$

$$\text{cov}(\eta_t, \alpha_t | Y_n) = -QR^T N_t L_t P_t \quad [19]$$

Illustratively, the likelihood function may be expressed or evaluated as a logarithmic likelihood function. For observed time series data $Y = \{y_1, \ldots, y_n\}$, the logarithmic likelihood function may be given by equation [20] below:

$$\log \mathscr{L}(Y) = -\frac{1}{2} np \log(2\pi) - \frac{1}{2} \sum_{t=1}^{n} \log|F_t| - \frac{1}{2} \sum_{t=1}^{n} v_t^T F_t^{-1} v_t \quad [20]$$

At block 218, the modeling system 500 or some other computing system can evaluate the analytical derivative of the likelihood function. The analytical derivative of the likelihood function with respect to the model parameters is used to determine the direction (e.g., positive or negative) and degree (e.g., magnitude) of adjustment to make to the model parameters to increase the likelihood that the parameters are the best set of parameters for the time series data being modeled. The state space representation determined as described above may be used (e.g., with the Shumway-Stoffer algorithm) to determine the analytical derivatives of the likelihood function for the current set of model parameters and to adjust the model parameters. In some embodiments, the functions that correspond to the analytical derivatives of the matrices and vectors (e.g., the H, Z, T, and Q matrices and the R vector) may be defined with respect to their component parts. These analytical derivatives can then be used in conjunction with the analytical derivatives of the components of the matrices and vectors to determine the analytical derivative of the likelihood function using the chain rule of calculus (or operations based on the chain rule). In some embodiments, the analytical derivative is the derivative of the likelihood function shown equation [20], above. This analytical derivative with respect to a scalar parameter θ may be expressed according to equation [21] below:

$$\frac{\partial}{\partial \theta} \log \mathscr{L}(Y) = (\hat{\alpha}_1 - a_1)^T P_1^{-1} \dot{a}_1 - \quad [21]$$

$$\frac{1}{2} \text{tr}\left( \dot{P}_1 [P_1^{-1} - P_1^{-1}\{(\hat{\alpha}_1 - a_1)(\hat{\alpha}_1 - a_1)^T + V_1 | P_1^{-1}]\}\right) -$$

$$\frac{1}{2} \sum_{t=1}^{n} \text{tr}\left(\dot{H}[H^{-1} - H^{-1}\{\hat{\varepsilon}_t \hat{\varepsilon}_t^T + \text{var}(\varepsilon_t | Y)\} H^{-1}]\right) +$$

$$\sum_{t=1}^{n} \text{tr}\left[\dot{Z}[\hat{\alpha}_t \hat{\varepsilon}_t^T + \text{cov}(a_t, \varepsilon_t | Y)] H^{-1}\right] -$$

-continued $$\frac{1}{2} \sum_{t=1}^{n-1} \text{tr}\left(\dot{Q}[Q^{-1} - Q^{-1}\{\hat{\eta}_t \hat{\eta}_t^T + \text{var}(\eta_t | Y)\}Q^{-1}]\right) -$$

$$\sum_{t=1}^{n-1} \text{tr}\left(\dot{R} \left| (R^T R)^{-1} R^T - [\hat{\eta}_t \hat{\eta}_t^T + \text{var}(\eta_t | Y)]Q^{-1}(R^T R)^{-1} R^T\right|\right) +$$

$$\sum_{t=1}^{n-1} \text{tr}\left[\dot{T}[\hat{\alpha}_t \hat{\eta}_t^T + \text{cov}(\alpha_t, \eta_t | Y)]Q^{-1}(R^T R)^{-1} R^T\right]$$

where the dot symbol denotes differentiation (e.g., $\dot{X}$ denotes $\partial X / \partial \theta$).

At block 220, the modeling system 500 or some other computing system can use the analytical derivative to modify the current parameters of the model. For example, the analytical derivative can be used as a gradient to determine the direction and degree to which individual parameters of the model are to be adjusted in order to improve the likelihood that the parameters are correct during the next iteration of the process 200 (e.g., the next time the likelihood function is evaluated).

At decision block 222, the modeling system 500 or some other computing system can evaluate one or more stopping criteria to determine whether to perform additional iterations of the process 200 or to finalize the model parameters. For example, the stopping criteria may include a threshold likelihood that the current model parameters are the correct model parameters, a maximum or desired number of iterations, a maximum or desired elapsed time, a minimum change to the value of the parameters, some other criteria, a combination thereof, etc. If the stopping criteria are not satisfied, then the process 200 can return to and repeat blocks 206-220, in which the state space representation of the updated model parameters is generated and evaluated to determine the likelihood that the updated model parameters are the best model parameters for the time series data. Otherwise, if the stopping criteria are satisfied, then the process 200 can terminate at block 224, and the most-recently determined model parameters can be provided to subsequent processes that use the estimated model to, e.g., forecast or predict future values.

Execution Environment

Figure 5:
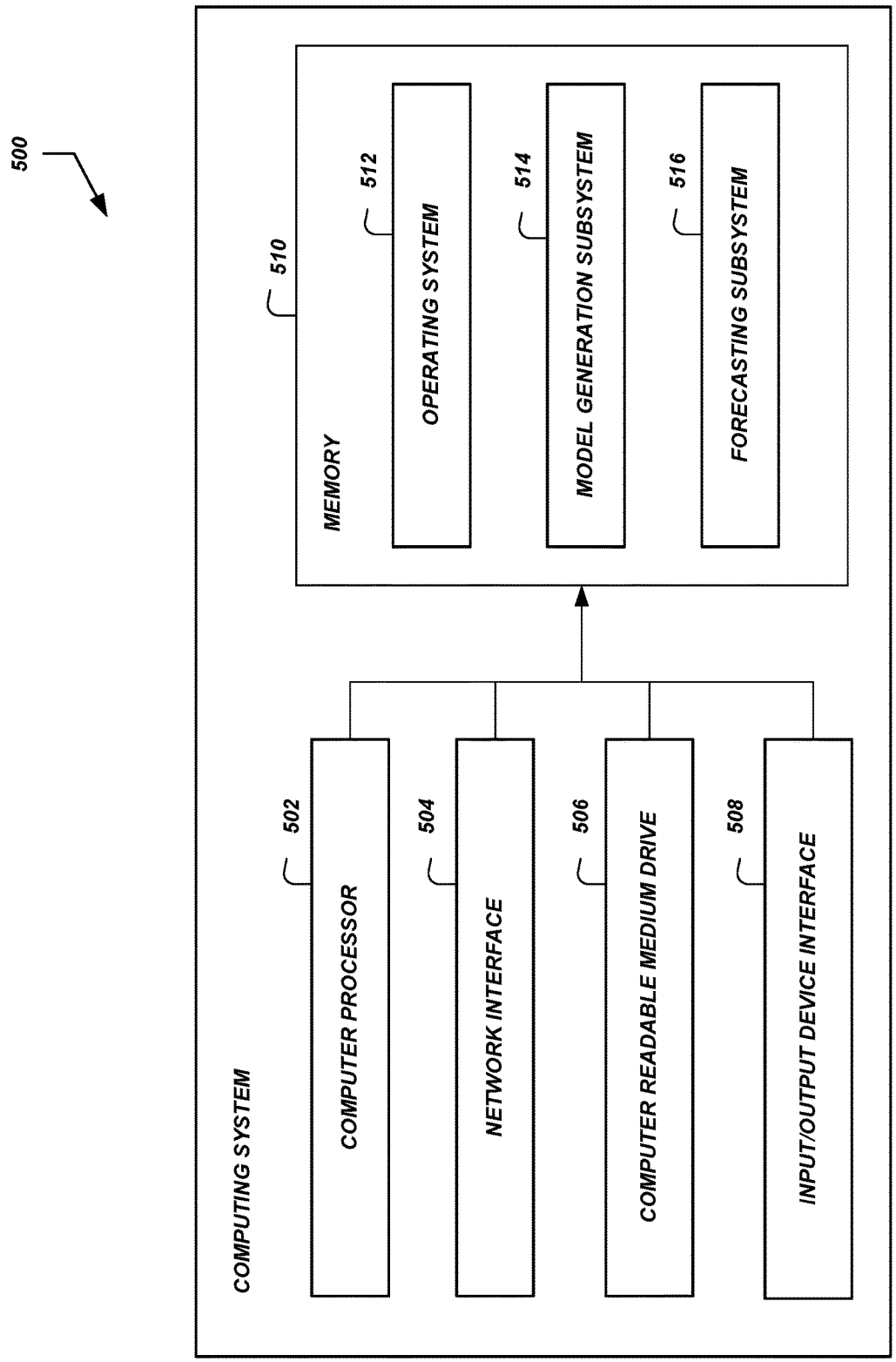
FIG. 5 is a block diagram of an illustrative modeling system configured to estimate and/or use models according to some embodiments.

FIG. 5 illustrates an example computing system 500 configured to execute the processes and implement the features described above. In some embodiments, the computing system 500 may include: one or more computer processors 502, such as physical central processing units ("CPUs"); one or more network interfaces 504, such as a network interface cards ("NICs"); one or more computer readable medium drives 506, such as a high density disk ("HDDs"), solid state drives ("SDDs"), flash drives, and/or other persistent non-transitory computer-readable media; an input/output device interface 508, such as an IO interface in communication with one or more microphones; and one or more computer readable memories 510, such as random access memory ("RAM") and/or other volatile non-transitory computer-readable media.

The network interface 504 can provide connectivity to one or more networks or computing systems. The computer processor 502 can receive information and instructions from other computing systems or services via the network interface 504. The network interface 504 can also store data directly to the computer-readable memory 510. The computer processor 502 can communicate to and from the computer-readable memory 510, execute instructions and process data in the computer readable memory 510, etc.

The computer readable memory 510 may include computer program instructions that the computer processor 502 executes in order to implement one or more embodiments. The computer readable memory 510 can store an operating system 512 that provides computer program instructions for use by the computer processor 502 in the general administration and operation of the computing system 500. The computer readable memory 510 can further include computer program instructions and other information for implementing aspects of the present disclosure. For example, in one embodiment, the computer-readable memory 510 may include a model generation subsystem 514 that performs the processes 100 and/or 200 described above (or portions thereof). As another example, the computer-readable memory 510 may include a forecasting subsystem 516 that performs operations described above for using an ARMA model estimated using the alternative state space representation.

In some embodiments, multiple computing systems 500 may communicate with each other via their respective network interfaces 504, and can implement model generation and/or use separately (e.g., each computing system 500 may execute one or more separate instances of the processes 100 and/or 200), in parallel (e.g., each computing system 500 may execute a portion of a single instance of a process 100 and/or 200), etc. For example, a distributed computing environment may provide hosted capabilities for implementing the systems and methods described herein. In order to provide such capabilities for predictive analytics, the distributed computing environment can provide integration points so that users can select the appropriate abstraction boundaries for their use case (e.g., bring-your-own-model interfaces, support for user-defined preprocessing functions, etc.). In addition, to handle potential issues related to the interface between user data and the modeling platform, the distributed computing environment may be fully integrated with the environment from which the data to be used in the modeling is obtained. To enable users to quickly deploy models, the distributed computing environment can provide automation of common model estimation tasks. In addition, to help users interpret the model results, the distributed computing environment can provide feature importance metrics, various performance measures from which to select, and integration with visualization tools to enable users to easily explore correlations between inputs and outputs.

Terminology

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or combinations of electronic hardware and computer software. To clearly illustrate this interchangeability, various illustrative components, blocks, modules, and steps have been described above generally in terms of their functionality. Whether such functionality is implemented as hardware, or as software that runs on hardware, depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a general purpose processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

What is claimed is:

1. A system comprising:
   a computer-readable memory storing executable instructions; and
   one or more processors programmed by the executable instructions to at least:
   obtain time series data representing values observed for an event over a first period of time;
   initialize first model parameters of an autoregressive moving average (ARMA) model, the first model parameters comprising an autoregressive parameter vector, a moving average parameter vector, and a noise parameter;
   generate an innovation variance matrix of a state space representation of the ARMA model using the noise parameter;
   generate a state transition matrix of the state space representation using the autoregressive parameter vector, wherein values of a top row of the state transition matrix are set equal to values in corresponding positions of the autoregressive parameter vector;
   generate an observation matrix of the state space representation using the moving average parameter vector;
   generate a column vector of the state space representation using the autoregressive parameter vector, wherein the column vector comprises a same number of elements as the autoregressive parameter vector;
   evaluate a likelihood function using the time series data and the first model parameters;
   evaluate an analytical derivative of the likelihood function using the state space representation, wherein the analytical derivative is a composite comprising a derivative of the innovation variance matrix, a derivative of the state transition matrix, a derivative of the observation matrix, a derivative of the column vector, and a derivative of individual model parameters of the first model parameters;
   determine second model parameters of the ARMA model using numerical optimization based at least partly on the first model parameters and the analytical derivative of the likelihood function; and
   select the ARMA model, with the second model parameters, from a plurality of ARMA models, wherein the ARMA model is selected based at least partly on an accuracy criterion.

2. The system of claim 1, wherein the executable instructions that program the one or more processors to initialize the first model parameters comprise executable instructions to generate a pseudo-random value for at least one of the first model parameters.

3. The system of claim 1, wherein the executable instructions that program the one or more processors to generate the state transition matrix comprise instructions to set values equal to 1 on a diagonal beginning in a leftmost column of a second row below a top row of the state transition matrix, wherein the diagonal extends to a column adjacent to a right-most column in a bottom row of the state transition matrix.

4. The system of claim 1, wherein the state space representation further comprises an observation noise variance matrix, and wherein the observation noise variance matrix comprises a single element having a zero value.

5. A computer-implemented method comprising:
   as performed by a computing system configured to execute specific instructions,
   determining a first matrix of a state space representation of an autoregressive moving average (ARMA) model using an autoregressive parameter vector of the ARMA model, wherein values of a top row of the first matrix comprise values in corresponding positions of the autoregressive parameter vector;
   determining a second matrix of the state space representation using a moving average parameter vector of the ARMA model;
   determining a column vector of the state space representation using the autoregressive parameter vector, wherein the column vector comprises a same number of elements as the autoregressive parameter vector;
   evaluating an analytical derivative of a likelihood function of the ARMA model using the state space representation, wherein the analytical derivative comprises a composite derivative based at least partly on the first matrix, the second matrix, the column vector, and current parameters of the ARMA model;

determining updated parameters of the ARMA model using the current parameters of the ARMA model and the analytical derivative; and executing a forecasting system to generate a forecast using the ARMA model with the updated parameters.

6. The computer-implemented method of claim 5, further comprising initializing a model parameter of the ARMA using a pseudo-random value generation algorithm.

7. The computer-implemented method of claim 5, further comprising evaluating the likelihood function using a Kalman filter.

8. The computer-implemented method of claim 5, wherein generating the first matrix comprises setting values equal to 1 on a diagonal beginning in a leftmost column of a second row below a top row of the first matrix, wherein the diagonal extends to a column adjacent to a right-most column in a bottom row of the first matrix.

9. The computer-implemented method of claim 5, further comprising generating a third matrix of the state space representation using a noise parameter of the ARMA model.

10. The computer-implemented method of claim 5, wherein executing the forecasting system comprises generating a forecasted value for an event in a future period of time using the updated parameters of the ARMA model and time series data representing values observed during a period of time prior to the future period of time.

11. The computer-implemented method of claim 5, further comprising generating an autoregressive integrated moving average (ARIMA) model using the updated model parameters and the ARMA model.

12. The computer-implemented method of claim 5, further comprising determining a value of 1 for a first element of the column vector and determining a value of 0 for each element below the first element of the column vector.

13. A non-transitory computer storage medium storing executable code, wherein the executable code configures a computing system to perform a process comprising:

determining a state transition matrix of a state space representation of an autoregressive moving average (ARMA) model using an autoregressive parameter vector of the ARMA model;

determining an observation matrix of the state space representation using a moving average parameter vector of the ARMA model;

determining a column vector of the state space representation using the autoregressive parameter vector, wherein the column vector comprises a same number of elements as the autoregressive parameter vector;

evaluating an analytical derivative of a likelihood function of the ARMA model using the state space representation, wherein the analytical derivative comprises a composite derivative based at least partly on the state transition matrix, the observation matrix, the column vector, and current parameters of the ARMA model;

determining updated parameters of the ARMA model using the current parameters of the ARMA model and the analytical derivative; and selecting the ARMA model, with the updated parameters, from a plurality of ARMA models based at least partly on a performance criterion.

14. The non-transitory computer storage medium of claim 13, wherein generating the state transition matrix comprises setting values equal to 1 on a diagonal beginning in a leftmost column of a second row below a top row of the state transition matrix, wherein the diagonal extends to a column adjacent to a right-most column in a bottom row of the state transition matrix.

15. The non-transitory computer storage medium of claim 13, the process further comprising generating an innovation variance matrix of the state space representation using a noise parameter of the ARMA model.

16. The non-transitory computer storage medium of claim 13, the process further comprising generating a forecasted value for an event in a future period of time using the updated parameters of the ARMA model and time series data representing values observed during a period of time prior to the future period of time.

17. The computer-implemented method of claim 5, further comprising:

generating one or more additional ARMA models;

determining a performance criterion for each of the one or more additional ARMA models;

determining a performance criterion for the ARMA model; and selecting the ARMA model to be used by the forecasting system based at least partly on the performance criterion for the ARMA model and the performance criterion for each of the one or more additional ARMA models.

18. The computer-implemented method of claim 17, wherein determining the performance criterion for the ARMA model comprises determining one of: an accuracy of the ARMA model, or a likelihood score associated with the ARMA model.

19. The computer-implemented method of claim 17, wherein generating the one or more additional ARMA models comprises generating a first additional ARMA model using a different set of initial parameter values than initial parameter values used to generate the ARMA model.

20. The computer-implemented method of claim 17, further comprising:

applying a first transformation to time series data values to generate first transformed time series data values, wherein the ARMA model is generated using the first transformed time series data values; and applying a second transformation to the time series data values to generate second transformed time series data values, wherein a first additional ARMA model is generated using the second transformed time series data values.

* * * * *

UNITED STATES PATENT AND TRADEMARK OFFICE
CERTIFICATE OF CORRECTION

PATENT NO. : 10,558,767 B1
APPLICATION NO. : 15/461382
DATED : February 11, 2020
INVENTOR(S) : Ramesh Natarajan Page 1 of 1

It is certified that error appears in the above-identified patent and that said Letters Patent is hereby corrected as shown below:

In the Specification

Column 2, Line 11, delete "(JOT)" and insert --(IOT)--.

Column 8, Line 52, delete "T-KPtZ" and insert --T-KtZ--.

Column 9, Line 13, delete "$\eta_t =$" and insert --$\hat{\eta}_t =$--.

Signed and Sealed this
Twenty-sixth Day of May, 2020

Andrei Iancu
*Director of the United States Patent and Trademark Office*